(12) United States Patent
Fernandez et al.

(10) Patent No.: US 6,278,613 B1
(45) Date of Patent: Aug. 21, 2001

(54) COPPER PADS FOR HEAT SPREADER ATTACH

(75) Inventors: Elstan Anthony Fernandez; Chow Seng Guan, both of Singapore (SG)

(73) Assignee: St Assembly Test Services Pte Ltd, Singapore (SG)

( * ) Notice: Subject to any disclaimer, the term of this patent is extended or adjusted under 35 U.S.C. 154(b) by 0 days.

(21) Appl. No.: 09/670,380

(22) Filed: Sep. 27, 2000

(51) Int. Cl.[7] ..................................................... H05K 7/20
(52) U.S. Cl. ........................... 361/719; 29/840; 257/707; 361/704
(58) Field of Search ..................................... 438/108, 122; 29/832, 840–842; 257/691, 706, 707, 712, 718, 719, 738, 778, 787, 796; 361/704, 764, 705–711, 707–719, 722, 761; 165/80.3, 185

(56) References Cited

U.S. PATENT DOCUMENTS

| | | | |
|---|---|---|---|
| 5,371,404 | 12/1994 | Juskey et al. | 257/659 |
| 5,847,929 | 12/1998 | Bernier et al. | 361/719 |
| 5,903,052 | 5/1999 | Chen et al. | 257/706 |
| 5,977,626 | 11/1999 | Wang et al. | 257/707 |
| 6,011,304 | 1/2000 | Mertol | 257/706 |
| 6,020,637 | 2/2000 | Karnezos | 257/738 |
| 6,160,705 | * 12/2000 | Stearns et al. | 361/704 |
| 6,163,458 | * 12/2000 | Li | 361/704 |
| 6,175,497 | * 1/2001 | Tseng et al. | 361/704 |

* cited by examiner

Primary Examiner—Gerald Tolin
(74) Attorney, Agent, or Firm—George O. Saile; Stephen B. Ackerman

(57) ABSTRACT

A new method is provided for the connection of heat conducting copper pads, eliminating the need for these heat conducting pads to be connected directly to the ground ring, further eliminating the need for the ground ring to be the external ring that is provided on a surface of the package.

44 Claims, 5 Drawing Sheets

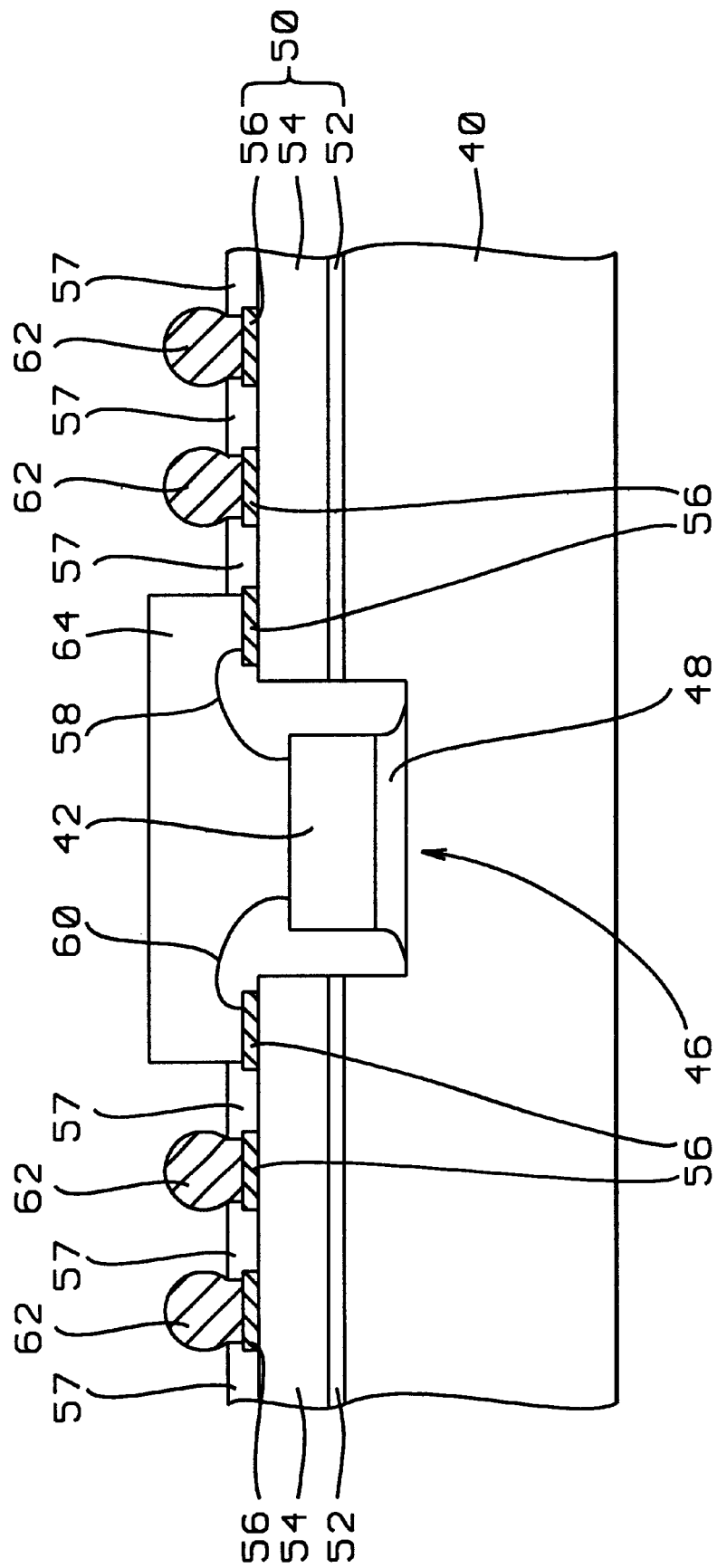
FIG. 1 – Prior Art

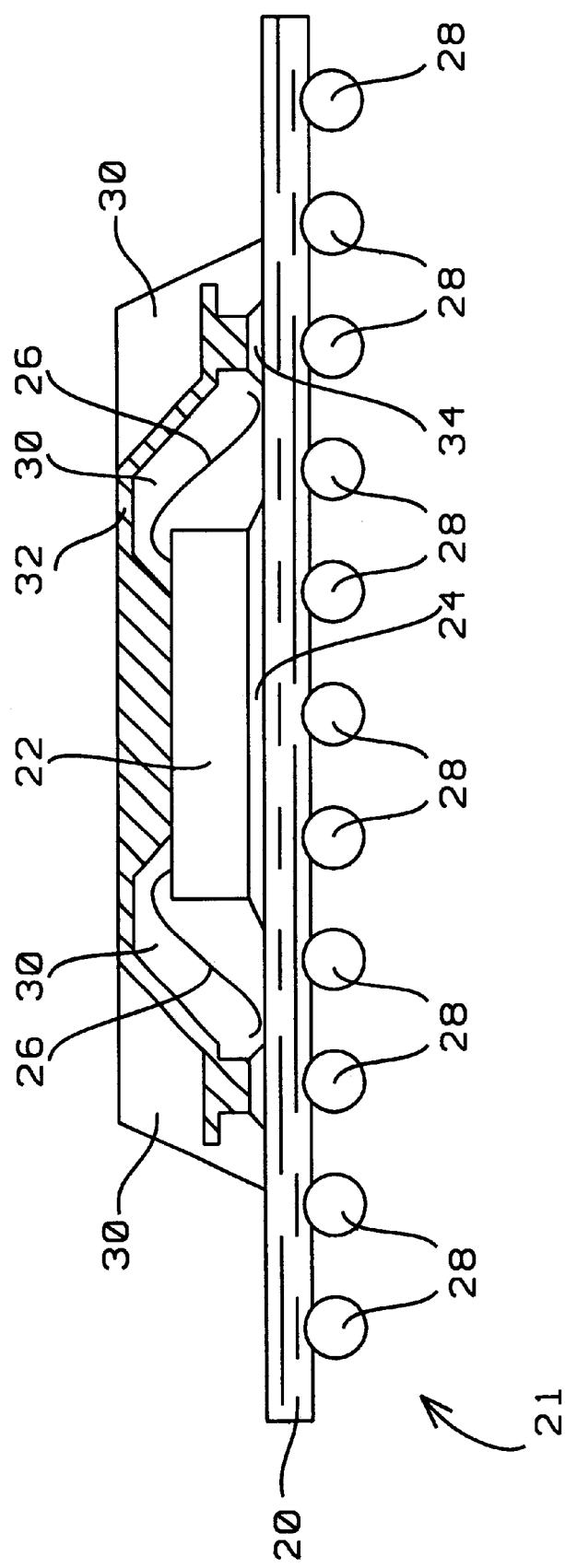
FIG. 2 – Prior Art

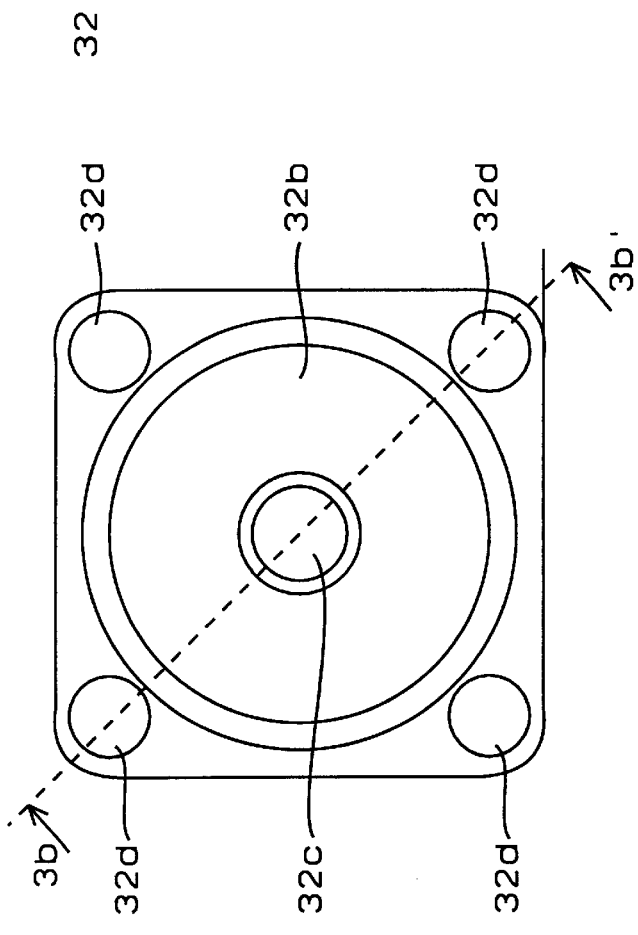
FIG. 3a – Prior Art
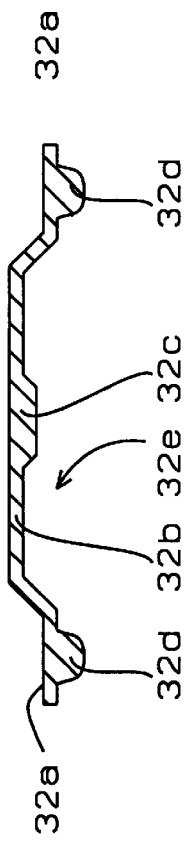
FIG. 3b – Prior Art

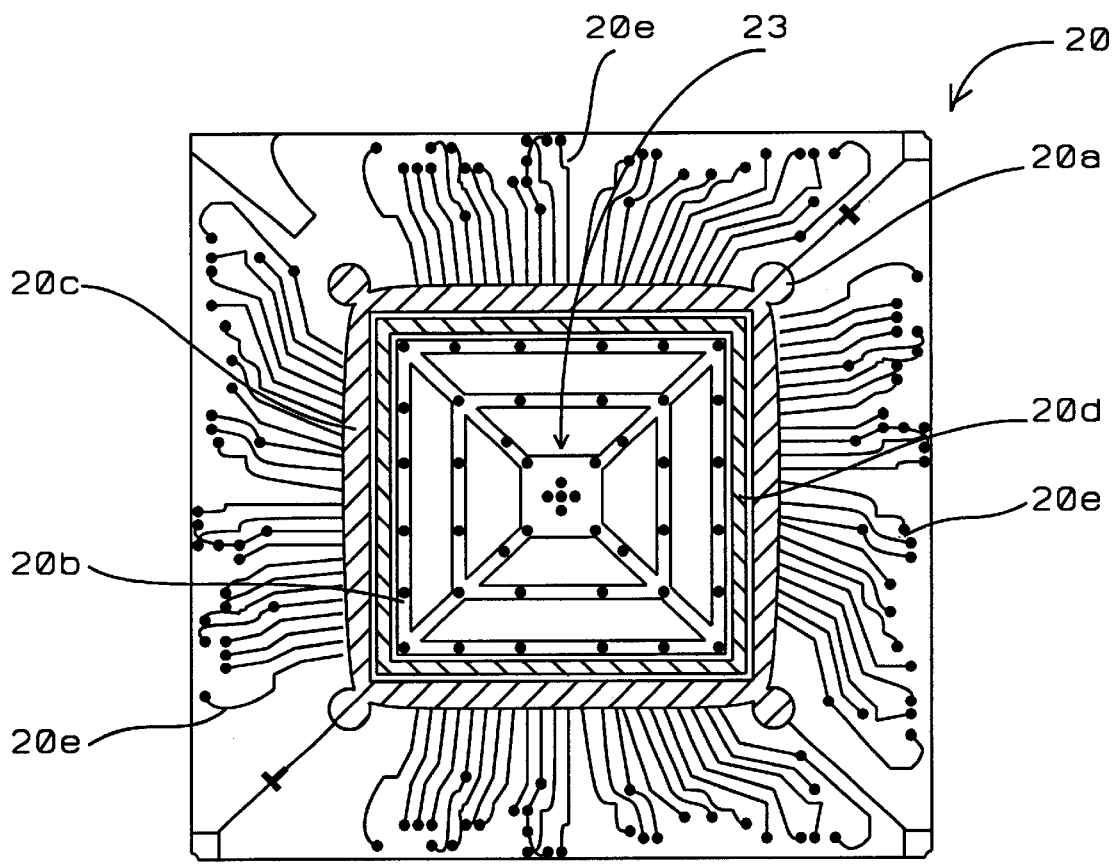
*FIG. 4 – Prior Art*
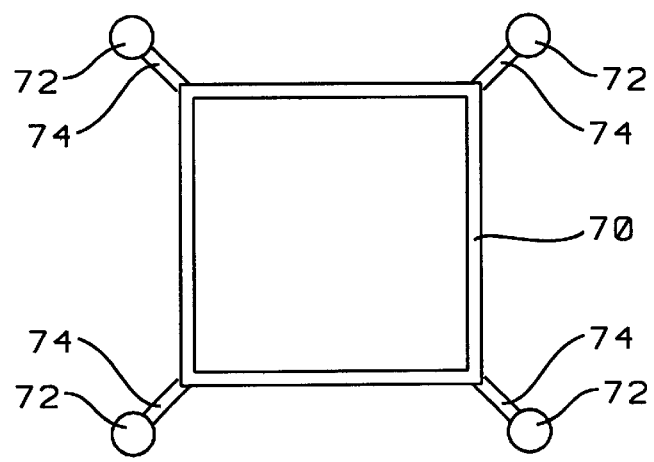
*FIG. 5*

COPPER PADS FOR HEAT SPREADER ATTACH

BACKGROUND OF THE INVENTION (1) Field of the Invention

The invention relates to the fabrication of integrated circuit devices, and more particularly, to a method of attaching the heat spreader of a PBGA package by attaching the copper pads to a non-external ground.

(2) Description of the Prior Art

The semiconductor industry has for many years achieved semiconductor device product improvements by device miniaturization and by increasing the device packaging density. Increased device density is typically implemented internally to the device, by creating device features of smaller dimensions. For devices that must be assembled into complete device packages, the completed semiconductor devices are frequently assembled in multi-device packages. This has led to the field of high density interconnect technology, mounting multilayer structures on the surface of a substrate and connecting integrated circuits to one another. This approach results in high wiring and high packaging density, whereby many integrated circuit chips are physically and electrically interconnected and connected to a single substrate commonly referred to as a multi-chip module (MCM). Electrical device isolation is provided by layers of dielectric, such as polyimide, that separate various functional planes (such as signal lines, power lines and ground planes) in the substrate. Metal interconnects can readily be provided by metal lines that are embedded in other layers of dielectric, thereby using vias (holes) to provide electrical connections between the interconnect lines. Interconnect lines must thereby be connected in such a manner that optimum performance can be realized for the completed package. For instance, adjacent layers must be formed such that primary signal propagation directions are orthogonal to each other. This is done in order to avoid crosstalk between lines that are in close physical proximity, which can induce false signals and noise between adjacent lines. Good planarity must also be maintained between adjacent layers of interconnect lines because the metal interconnect lines are typically narrow in width and thick in a vertical direction (in the range of 5 to 10 microns thick) and must be patterned with microlithography. Patterned layers must therefore be substantially flat and smooth (i.e. have good planarity) so that these layers can serve as a base for the next layer.

One of the original approaches that has been used to create surface mounted, high pin count integrated circuit packages has been the use of Quad Flat Packs (QFP's) with various pin configurations. For QFP's, closely spaced leads along the four edges of the flat package are used for making electrical connections from where the electrical connections are distributed to the surrounding circuitry. The input/output connections that can be made to QFP packages are therefore confined to the edges of the flat package, which limits the number of I/O connections that can be made to the QFP even in applications where the pin to pin spacing is small. QFP's have found to be cost effective for semiconductor devices where the device I/O pin count does not exceed 200. To circumvent this limitation, a new package, a Ball Grid Array (BGA) package has been introduced. For the BGA package, the electrical contact points are distributed over the entire bottom surface of the package, thereby eliminating the restriction of having I/O connects only around the periphery of the package. More contact points with greater spacing between the contact points can therefore be allocated across the BGA package than was the case with the QFP's. The contact points that are used for the BGA package are typically solder balls that have the added advantage of facilitating flow soldering of the package onto a printed circuit board.

A Ball Grid Array (BGA) is an array of solderable balls placed on a chip carrier, such as a Printed Circuit Board (PCB). The balls contact a printed circuit board in an array configuration where, after reheat, the balls connect the chip to the printed circuit board. BGA's are known with 40, 50 and 60 mils spacings in regular or staggered array patterns. The BGA package is part of a larger packaging approach that is often referred to as Chip Scale Packages (CSP), which is a packaging approach that is considered to be different from the previously highlighted approach of MCM's.

Flip Chip packages have in general been used to accommodate increased I/O count combined with increased high requirements for high performance IC's. Flip chip technology fabricates bumps (typically Pb/Sn solder) on Al pads and interconnects the bumps directly to the package media, which are usually ceramic or plastic based. The flip-chip is bonded face down to the package through the shortest paths. This approach can be applied to single-chip packaging and to higher integrated levels of packaging (in which the packages are larger) and to more sophisticated packaging media that accommodate several chips to form larger functional units.

For the packaging of semiconductor devices, the package in which the devices are contained provides protection of the device from environmental influences such as mechanical damage or damage caused by moisture affecting exposed surfaces of the device. Part of the package design includes the design of electrically conductive interfaces that enable the device to be electrically interconnected with surrounding circuitry. Increased device density has not only created new demands for input/output connections of the device but has also caused considerable more thermal energy to be expanded per cubic volume content of the device, resulting in increased demands on methods of heat exchange between the device and its surrounding and supporting surfaces. In many of the semiconductor device packages, the device is mounted in close physical proximity to a heat sink combined with methods, such as connections of low resistance to thermal heat conductivity, are implemented as part of the package.

It is therefore the objective of providing a package for semiconductor devices, such as flip chips, that has a direct ground connect between the device and a heatsink on the surface of which the device is mounted. In a typical device packaging arrangement, a substrate layer that contains for instance three layers of interconnects, is used to connect the device to surrounding circuitry. Electrical connections are made between the flip chip and the substrate layers. Contact points provided in or on the surface of the device make contact with contact points in the top surface of the substrate layer, the substrate layer re-distributes (fan-out) the device contact points. One of the approaches that has been used to create high thermal interchange between the device and the heatsink is to create one or more openings in the substrate layers. These openings are filled with a low-resistivity material, establishing electrical contact between one selected copper pad of the copper traces (in the upper layer of the substrate layer) and the heatsink. Connecting the ground point of the IC die to a selected copper pad of metal (for instance copper) traces completes the ground path between the ground of the IC die and the heatsink. A molding is typically encased between the lower surface of the device and the upper surface of the substrate. This molding is referred to as underfill since it is filled in under the original semiconductor device. A heat sink is typically attached to the lower surface of the device.

FIG. 1 shows an example of a Prior Art method of packaging a BGA/flip chip whereby a major part of the package is a heatsink 40. The semiconductor chip or die 42 takes up the center of the package; contact points to die 42 are closely spaced around the periphery of die 42. Cavity 46 is provided in the heatsink 40 for the mounting of the Integrated Circuit (IC) chip 42. Heatsink 40 has a surface that is electrically conductive. The top of the IC chip 42 is in close physical contact with the heatsink 40 via a thin adhesive layer 48 of thermally conductive epoxy that is deposited over the bottom surface of cavity 46, the IC die 42 is attached to the heatsink 40 by means of this layer 48. The adhesive layer 48 is cured after the IC die 42 has been inserted into cavity 46. The contact points of the die 42 are conductively bonded, using wire-bonding techniques, to the substrate layer 50.

The bond wires 58 and 60 are shown here as applied for the connection of IC die 42 to layer 56 of the substrate 50. The substrate 50 has been shown as containing three layers, that is layers 52, 54 and 56. Layer 52 is typically an adhesive layer that directly connects the substrate layer 50 to the heatsink 40. This establishes the necessary mechanical support for the wire bonding operation. Layer 54 can contain a stiffener that provides rigidity to the substrate layer 50, layer 56 contains copper traces that further interconnect the solder balls 62 to the surrounding circuitry. Wires 58 and 60 provide wire bond connections between contact points (not shown) on the IC die 42 and copper traces contained in layer 56 of the substrate layer 50.

The substrate layer 50 contains, as has previously been indicated, adhesive layer 52, layer 54 of stiffener for the substrate layer and copper traces in layer 56 for interconnect of the IC die 42. In addition, a solder mask layer 57 (typically a layer of dielectric) with openings is deposited over the surface of substrate layer 50, the openings in solder mask 57 expose the copper traces in layer 56 to provide solder connections between the copper traces of layer 56 and the contact balls 62.

FIG. 1 also shows how the IC die 42 is encapsulated using an encapsulation material 64 that is syringe dispensed to surround die 42, forming the encapsulation layer 64. It must be noted that this layer not only surrounds the IC die 42 but also covers the bond wires 58 and 60. The encapsulation layer 64 is cured after injection.

Other methods of encapsulating a semiconductor device provide a heatsink that overlays the semiconductor device. The semiconductor device is mounted on the surface of a substrate by means of a layer of epoxy. Gold bond wires can connect electrical contact points that are provided in the upper surface of the device to the substrate, contact balls are provided in or on the lower surface of the device for additional connections (typically for high frequency signal transfer) between the device and the substrate. A molding compound is used to encapsulate the die and the bond wires, providing environmental protection to the die. By making high heat conductivity connections between the bottom of the die, heat generated in the die can be transferred from the die to the substrate. For applications where additional heat must be removed from the semiconductor die, the molding compound that encapsulates the die can be partially removed from above the upper surface of the die, partially exposing this upper surface. This exposed portion of the upper surface of the die can then be brought in direct physical contact with a heatsink that overlays the semiconductor die. The heatsink is typically formed such that it can also be attached to the underlying substrate, resulting in a mechanically strong package. Where necessary, the heat sink in turn can be encapsulated in a molding compound that is now formed overlying the upper surface of the package, the largest area of contact between the molding compound and the package being the upper surface of the heatsink.

The invention addresses aspects of attachment of a semiconductor device to a heatsink. The invention provides a method that simplifies this attachment.

U.S. Pat. No. 5,977,626 (Wang et al.) teach a heat spreader for a PBGA.

U.S. Pat. No. 6,020,637 (Karnezos) shows a removable heat spreader for a package.

U.S. Pat. No. 6,011,304 (Mertol) teaches a heat spreader for a cavity down BGA.

U.S. Pat. No. 5,903,052 (Chen et al.) show a heat spreader attached to the bottom of a substrate. However, this reference differs from the invention.

U.S. Pat. No. 5,847,929 (Bernier et al.) show a method for a heatsink.

U.S. Pat. No. 5,371,404 (Juskey et al.) show a method where the ground acts as part of a heatsink/shield.

SUMMARY OF THE INVENTION

A principle objective of the invention is to provide a new method of connecting a heatsink to supporting copper pads.

Another objective of the invention is to increase package design flexibility by eliminating the need to connect heat conducting copper pads directly to a ground ring of the package.

Yet another objective of the invention is to provide a method of connecting heat-conducting pads in such a manner that the ground ring of the package is no longer required to be the external ring of the package.

In accordance with the objectives of the invention a new method is provided for the connection of heat conducting copper pads. The invention eliminates the need for the heat conducting pads to be connected directly to the ground ring, further eliminating the need for the ground ring to be the external ring that is provided on a surface of the package.

BRIEF DESCRIPTION OF THE DRAWINGS

FIG. 1 shows a cross section of a Prior Art method of creating a semiconductor device package, including a heatsink.

FIG. 2 shows a cross section of a semiconductor package, entered from U.S. Pat. No. 5,977,626 (Wang et al.) for reference.

FIG. 3 shows a top view and a side view of a head slug, entered from U.S. Pat. No. 5,977,626 (Wang et al.) for reference.

FIG. 4 shows a top view of a substrate, entered from U.S. Pat. No. 5,977,626 (Wang et al.) for reference.

FIG. 5 shows a top view of a simplified diagram of Prior Art connection of heat conducting copper pads to a ground ring of the package.

DESCRIPTION OF THE PREFERRED EMBODIMENTS

Figure 6:
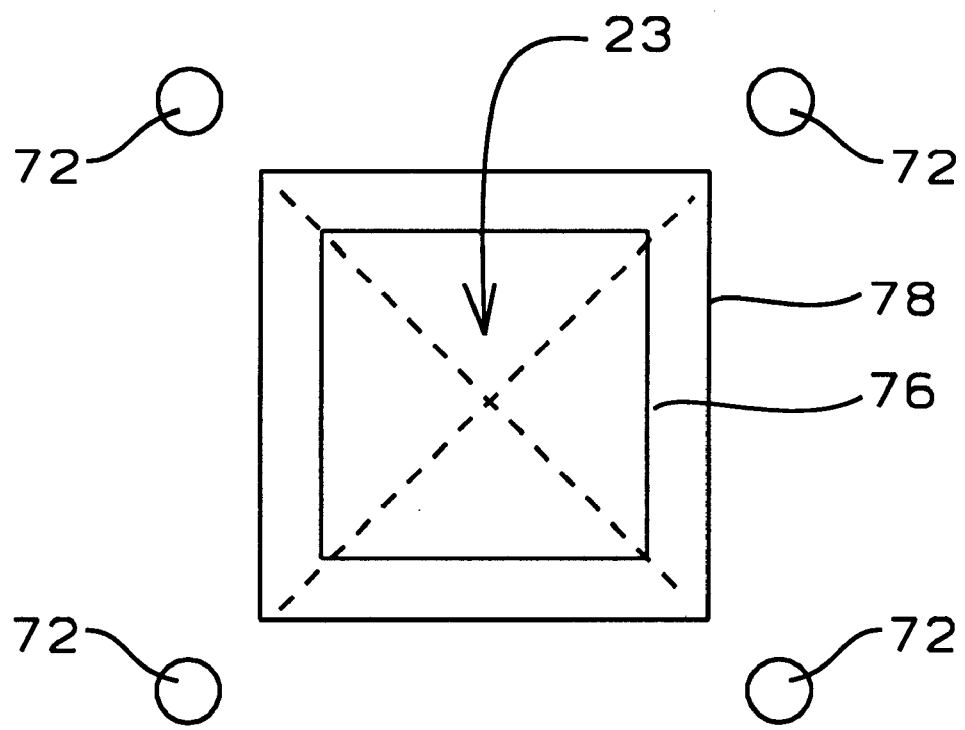
FIG. 6 shows a top view of a simplified diagram of a first connection of the invention of heat conducting copper pads to a ground ring of the package.

FIG. 2 shows across section of a semiconductor package 21, entered from U.S. Pat. No. 5,977,626 (Wang et al.) for purposes of reference. Highlighted in FIG. 2 are:

20 is a semiconductor substrate that may contain one or more layers of electrical interconnect, including contact pads and vias 22 is a semiconductor device or die 24 is a layer of epoxy that is spread over the surface of substrate 20 and is used to attached die 22 to the surface of substrate 20

26 are bond wires that connect the top surface of die 22 to metal traces in or on the surface of substrate 20

28 are contact balls or solder bumps that are provided in the lower surface of substrate 20 for further interconnect of the package 21 shown in cross section in FIG. 2

30 is a layer of encapsulation material that is applied for protection of package 21 from environmental damage and that additionally encloses bond wires 26, and 32 is the heatsink of the package that is also encapsulated by the layer 30 of encapsulation material.

Details that relate to the various components that have been highlighted in FIG. 2 will not be further discussed at this time. These details are either well known in the art or are readily available from the U.S. Pat. No. 5,977,626 (Wang et al.) specifications while, in addition, these details do not directly apply to the present invention. The same approach will be followed for FIGS. 3 and 4.

FIG. 3 shows a top view and a side view of a head slug, entered from U.S. Pat. No. 5,977,626 (Wang et al.) for purposes of reference. Highlighted in FIG. 3 are the following details. These details are highlighted in both FIG. 3a and FIG. 3b but are easiest to interpret using FIG. 3b, as follows:

32 is the heatsink or heat spreader of the semiconductor device package (see also FIG. 2)

32a is the upper surface of the heatsink 32

32b is a concave part of the profile of heatsink 32 that is shaped such that the heatsink does not come into physical contact with the semiconductor device that is mounted underneath and covered by the heatsink 32

32c is the center of the lower surface of the heatsink that is shaped such that the heatsink will make physical contact with the semiconductor device over the expanse of surface 32c 32d are the supporting members ("legs") of the heatsink 32, the heatsink contacts the underlying substrate (20, FIG. 4) with four members 32d that have been provided on the four corners of heatsink 32, and 32e is the cavity of the heatsink underneath which the semiconductor device is mounted, the upper surface of the semiconductor device faces and is in contact with the heatsink 32, the lower surface of the device faces and is in contact with the substrate of the package.

The side view of the heatsink that is shown in FIG. 3b has been created by taking a cross section of the top view of FIG. 3a along the line 3b–3b' of FIG. 3a.

FIG. 4 shows a top view of a substrate 20, entered from U.S. Pat. No. 5,977,626 (Wang et al.) for purposes of reference. For clarity of understanding, it must be pointed out that the semiconductor device that is mounted on the surface of substrate 20 is aligned with (mounted above) the center 23 of the substrate 20 that is shown in top view in FIG. 4. The side surfaces of the semiconductor device are, after the device has been mounted on the surface of the substrate 20, parallel with the sides or boundaries of the substrate (not highlighted in FIG. 4) as shown in FIG. 4. The semiconductor device overlies the surface of substrate 20 over an area that is bounded by the structure 20b, the die paddle that is shown in FIG. 4.

Highlighted in FIG. 4 are the following details, all details that are highlighted are part of the conductive pattern that is created in or on the surface of the substrate 20. As follow:

20a are (four) ground pads that are located in (four) locations or corners that surround the surface area of the substrate over which the semiconductor device is mounted; these (four) ground pads 20a are conductively interconnected (see item 20c below)

20b is a conductive ring that overlies the surface region of the substrate above which the semiconductor is mounted; conductive ring 20b surrounds the center 23 of substrate 20 on four sides, as shown 20c is the ground ring of the device mounting network 20d is the power ring on the surface of the substrate 20

20e are metal traces that connect the perimeter of the semiconductor device with the perimeter of the substrate 20 for further interconnect of the device.

The following sequence of traces on the surface of substrate is of interest, see FIG. 4, starting at the center 23 of substrate 20:

1) a conductivity ring (20b) which is under the surface of the semiconductor device (not shown in FIG. 4) after the device has been mounted on the substrate, the conductivity ring is surrounded by 2) a power ring (20d), which is surrounded by 3) a ground ring (20c).

For ease of retention, the above sequence can best be remembered as conductivity (ring) followed by power (ring) followed by ground (ring), starting from the center of the substrate 20.

The heatsink 32 makes contact with the substrate 20 by means of four (extended) corners 20a of the ground ring 20c. It is therefore clear that the metal pads 20a on which the heatsink 32 rests (and via which the heatsink 32 makes contact with the substrate 20) are part of the ground ring 20c. It is therefore clear that the metal, for instance copper, of the contact pads are connected directly to the ground ring. By using this approach, the ground ring must be ring that is external to the supporting metal traces under and adjacent to the location over which the device is mounted. This presents a limitation or lack of flexibility in creating the metal traces, a limitation that the invention eliminates.

The invention changes the method by which the metal pads are connected to the ground ring.

FIG. 5 shows a top view of a simplified diagram of Prior Art connection of heat conducting copper pads to a ground ring of the package. The ground ring is highlighted with 70 (functionally identical with the ground ring 20c of FIG. 4), the metal pads on which the heatsink rests are highlighted with 72 (functionally identical with the four ground pads 20a of FIG. 4). It is clear that by physically separating the ground pads from the ground ring, a number of possibilities are provided for the creation and connection of these two entities. One of the possibilities is shown in FIG. 5, where metal (copper) traces 74 are provided (as separate entities) that connect the ground pads 72 with the ground ring 70. By making this connection 74, the ground pads can be connected to a ground ring that does not need to be the outermost ring on the surface of the substrate underlying a thereover mounted semiconductor die. The design sequence of, starting from the center 23 (FIG. 4) of the substrate does therefore not (as opposed to Prior Art) have to be conductivity ring, power ring, ground ring. It must thereby be remembered that the connection 74 does not have to be made on the surface of substrate 20 but can be made as one of the layers that is internal to (under the surface of) the substrate 20. Another way in which this connection can be established is by connecting a bond wire between the ground ring and the ground pads.

FIG. 6 shows a top view of a simplified diagram of a first connection of the invention of heat conducting copper pads to a ground ring of the package. The arrangement that is shown in FIG. 6 shows the sequence, starting from the center 23 of the geometric figures that form the various rings, of ground ring 76 after which (and on the outside of the ground ring) the power ring 78 follows. The die paddle or conductive ring (20b, FIG. 4, not shown in FIG. 6) remains in the center and is surrounded by ground ring 76. In order to connect any of the ground pads 72 to the ground ring 76, a via can be created at that ground pad 72 that is matched by a matting via in a point of choice close to or as part of the ground ring 76. An (underlying) conductive trace can connect the two vias, connecting the ground pad 72 to the ground ring 76. It is clear that the same results of connecting ground pad to ground ring can be obtained with a bond wire whereby, for the example shown in FIG. 6, the bond wire is mounted over the power ring 78. Any or all four of the ground pads 72 can in this manner be connected to the ground ring 76.

The essence of the invention can therefore be summarized as follows: Prior Art provided the sequence of, starting from the center of the substrate over which a semiconductor die is mounted, conductive ring followed by power ring followed by ground ring to which (four) ground pads are connected. The invention disconnects the ground pads from the ground ring in the original layout of the wiring in or on the surface of the substrate. The invention therefore allows for maintaining the sequence of conductive ring followed by power ring followed by ground ring. The invention in addition allows for the sequence of conductive ring followed by ground ring followed by power ring.

It is clear that, by physically disconnecting or not establishing a connection between the ground pad and the ground ring, the ground ring can be placed surrounding the conducting ring or die paddle of the semiconductor device and is not restricted to any particular sequence between the ground ring and the power ring.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of attaching a heatsink to a substrate, said heatsink having been provided with three or four supporting members that form a mechanical interface between the heatsink and the substrate to which the heatsink is attached, said method comprising:

providing a square or rectangular shaped semiconductor substrate, said substrate comprising a geometric center formed by an intersection of diagonals of said square or rectangular substrate, further comprising a periphery or edge, whereby said substrate has been provided with interconnect metal in sequence and starting from the geometric center of the substrate, said interconnect metal comprising conductive traces in or on a surface area that expands from a geometric center of the surface of the substrate in a square or rectangular pattern, hereby referred to as the central surface area of the substrate, said central surface area of the substrate comprising the surface of the substrate over which a semiconductor device is mounted, said network of conductive traces provided in or on the surface of said central surface area providing a common point of electrical connection, the surface area of said central surface area being about equal in size to a surface area of the substrate over which a semiconductor die is mounted, said semiconductor substrate further comprising a first conductive trace of either a power trace or a ground trace that surrounds said central surface area of the substrate, forming a rectangular or square pattern in or on the surface of said substrate, said semiconductor substrate further comprising a second conductive trace of either a power trace or a ground trace that surrounds said first conductive trace, said first conductive trace and said second conductive trace not simultaneously comprising a power trace and a ground trace, said semiconductor substrate further comprising three or four ground pads that are located surrounding said second conductive trace, said ground pads serving as pedestals on which said supporting members of said heatsink are placed, said three or four ground pads making contact with said three or four supporting members of said heatsink, said semiconductor substrate further comprising a network of input/output interconnect traces that expand from said central surface area of the substrate towards the periphery of the substrate, at least one of said interconnect traces originating around the periphery of said second conductive trace while not making contact with said second conductive trace, at least one of said interconnect traces terminating in a contact pad that is located at about the periphery of the substrate, said interconnect traces providing means for interconnecting said semiconductor device that is mounted on said substrate to at least one contact pad in the periphery of said substrate;

providing means for interconnecting said three of four ground pads with said first or said second trace whereby said interconnection is provided to the first or second trace that is a ground trace; and bringing said three or four supporting members of said heatsink into contact with said three or four ground pads provided on the surface of said semiconductor substrate.

2. The method of claim 1 wherein said means for connecting said ground pads to said first or to said second conductive trace comprises:

an interconnecting trace in or on the surface of said substrate, having a first endpoint and a second endpoint;

a via interconnect at said first endpoint of said interconnecting trace, said via providing electrical contact with at least one ground pad on the surface of the semiconductor substrate; and a via interconnect at said second end point of said interconnecting trace, said via providing electrical contact with the conductive trace of said first conductive trace or said second conductive trace that comprises a ground trace.

3. The method of claim 1 wherein said means for connecting said ground pads to said first or to said second conductive trace comprises:

a bond wire on the surface of said substrate, having a first end point and a second end point;

a contact pad at said first end point of said interconnecting trace, said contact pad providing electrical contact with at least one ground pad on the surface of the substrate; and a contact pad at said second end point of said interconnecting trace, said contact pad providing electrical contact with the conductive trace of said first conductive trace or said second conductive trace that comprises a ground trace.

4. A method for attaching a heatsink to a semiconductor substrate, said heatsink having been provided with supporting members for contact between the heatsink and the substrate, the substrate having been provided with ground pads for the contact between the substrate and the heatsink, said ground pads being isolated pads without electrical connections to other interconnect metal on the surface of the substrate, said substrate further having been provided with a first conductive trace and a second conductive trace with both traces surrounding a central surface area of the substrate above which a semiconductor device is to be mounted, comprising:

establishing electrical contact between at least one of said ground pads and a conductive trace;

positioning the supporting members of the heatsink above the ground pads on the surface of the substrate; and connecting the supporting members of the heatsink with the ground pads on the surface of the substrate.

5. The method of claim 4 wherein said establishing electrical contact between at least of said ground pads and the conductive trace comprises:

providing an interconnecting trace in or on the surface of said substrate, having a first endpoint and a second endpoint;

providing a via interconnect at said first endpoint of said interconnecting trace, said via providing electrical contact with at least one ground pad on the surface of the semiconductor substrate; and providing a via interconnect at said second end point of said interconnecting trace, said via providing electrical contact with the conductive trace.

6. The method of claim 4 wherein said establishing electrical contact between at least of said ground pads and the conductive trace comprises:

providing a bond wire on the surface of said substrate, having a first end point and a second end point;

providing a contact pad at said first end point of said interconnecting trace, said contact pad providing electrical contact with at least one ground pad; and providing a contact pad at said second end point of said interconnecting trace, said contact pad providing electrical contact with the conductive trace on the surface of the substrate.

7. The method of claim 4 wherein said substrate comprises a square or rectangular shaped semiconductor substrate on the surface of which interconnect metal is provided, said substrate comprising a geometric center formed by an intersection of diagonals of said square or rectangular substrate, further comprising a periphery or edge, whereby said substrate has been provided with interconnect metal in sequence and starting from the geometric center of the substrate, said interconnect metal comprising conductive traces in or on a surface area that expand from a geometric center of the surface of the substrate in a square or rectangular pattern, hereby referred to as the central surface area of the substrate, said central surface area of the substrate comprising the surface of the substrate over which a semiconductor device is mounted, said network of conductive traces provided in or on the surface of said central surface area providing a common point of electrical connection, the surface area of said central surface area being about equal to a surface area of the substrate over which a semiconductor die is mounted, said semiconductor substrate further comprising a first conductive trace that surrounds said central surface area of the substrate, forming a rectangular or square pattern in or on the surface of said substrate, said semiconductor substrate further comprising a second conductive trace that surrounds said central surface area of the substrate, said first conductive trace and said second conductive trace not simultaneously comprising a power trace and a ground trace, said semiconductor substrate further comprising ground pads that are located surrounding said first and said second conductive trace, said ground pads serving as pedestals on which said supporting members of said heatsink are placed, said ground pads making contact with said supporting members of said heatsink, said semiconductor substrate further comprising a network of input/output interconnect traces that expand from said central surface area of the substrate towards the periphery of the substrate, at least one of said interconnect traces originating around the periphery of said second conductive while not making contact with said second conductive trace, at least one of said interconnect traces terminating in a contact pad that is located at about the periphery of the substrate, said interconnect traces providing means for interconnecting said semiconductor device that is mounted on said substrate to at least one contact pad in the periphery of said substrate.

8. The method of claim 7 wherein said first conductive trace surrounds said second conductive trace.

9. The method of claim 7 wherein said second conductive trace surrounds said first conductive trace.

10. The method of claim 9 wherein said first conductive trace comprises a ground trace.

11. The method of claim 9 wherein said first conductive trace comprises a power trace.

12. The method of claim 9 wherein said second conductive trace comprises a ground trace.

13. The method of claim 9 wherein said second conductive trace comprises a ground trace.

14. The method of claim 9 wherein said first conductive trace comprises a power trace while said second conductive trace comprises a ground trace.

15. The method of claim 9 wherein said ground pads that are located surrounding said first and said second conductive trace comprise three ground pads.

16. The method of claim 9 wherein said ground pads that are located surrounding said first and said second conductive trace comprise four ground pads.

17. The method of claim 4 wherein said the supporting members of the heatsink comprise three supporting members.

18. The method of claim 4 wherein said the supporting members of the heatsink comprise four supporting members.

19. The method of claim 9 wherein said ground pads on the surface of the substrate comprise three ground pads.

20. The method of claim 9 wherein said ground pads on the surface of the substrate comprise four ground pads.

21. The method of claim 9 wherein the number of ground pads provided on the surface of the substrate is equal to the number of supporting members of the heatsink.

22. The method of claim 9 wherein ground pads provided on the surface of the substrate are not equal in number to the supporting members of the heatsink.

23. A semiconductor package for attaching a heatsink to a substrate, said heatsink having been provided with three or four supporting members that form a mechanical interface between the heatsink and the substrate to which the heatsink is attached, said package comprising:

a square or rectangular shaped semiconductor substrate, said substrate comprising a geometric center formed by an intersection of diagonals of said square or rectangular substrate, further comprising a periphery or edge, whereby said substrate has been provided with interconnect metal in sequence and starting from the geometric center of the substrate, said interconnect metal comprising conductive traces in or on a surface area that expands from a geometric center of the surface of the substrate in a square or rectangular pattern, hereby referred to as the central surface area of the substrate, said central surface area of the substrate comprising the surface of the substrate over which a semiconductor device is mounted, said network of conductive traces provided in or on the surface of said central surface area providing a common point of electrical connection, the surface area of said central surface area being about equal in size to a surface area of the substrate over which a semiconductor die is mounted, said semiconductor substrate further comprising a first conductive trace of either a power trace or a ground trace that surrounds said central surface area of the substrate, forming a rectangular or square pattern in or on the surface of said substrate, said semiconductor substrate further comprising a second conductive trace of either a power trace or a ground trace that surrounds said first conductive trace, said first conductive trace and said second conductive trace not simultaneously comprising a power trace and a ground trace, said semiconductor substrate further comprising three or four ground pads that are located surrounding said second conductive trace, said ground pads serving as pedestals on which said supporting members of said heatsink are placed, said three or four ground pads making contact with said three or four supporting members of said heatsink, said semiconductor substrate further comprising a network of input/output interconnect traces that expand from said central surface area of the substrate towards the periphery of the substrate, at least one of said interconnect traces originating around the periphery of said second conductive trace while not making contact with said second conductive trace, at least one of said interconnect traces terminating in a contact pad that is located at about the periphery of the substrate, said interconnect traces providing means for interconnecting said semiconductor device that is mounted on said substrate to at least one contact pad in the periphery of said substrate;

means for interconnecting said three of four ground pads with said first or said second trace whereby said interconnection is provided to the first or second trace that is a ground trace; and said three or four supporting members of said heatsink brought into contact with said three or four ground pads provided on the surface of said semiconductor substrate.

24. The semiconductor package of claim 23 wherein said means for connecting said three or four ground pads to said first or to said second conductive trace comprises:

an interconnecting trace in or on the surface of said substrate, having a first endpoint and a second endpoint;

a via interconnect at said first endpoint of said interconnecting trace, said via providing electrical contact with at least one ground pad on the surface of the semiconductor substrate; and a via interconnect at said second end point of said interconnecting trace, said via providing electrical contact with the conductive trace of said first conductive trace or said second conductive trace that comprises a ground trace.

25. The semiconductor package of claim 23 wherein said means for connecting said three or four ground pads to said first or to said second conductive trace comprises:

a bond wire on the surface of said substrate, having a first end point and a second end point;

a contact pad at said first end point of said interconnecting trace, said contact pad providing electrical contact with at least one ground pad on the surface of the substrate; and a contact pad at said second end point of said interconnecting trace, said contact pad providing electrical contact with the conductive trace of said first conductive trace or said second conductive trace that comprises a ground trace.

26. A semiconductor package for attaching a heatsink to a semiconductor substrate, said heatsink having been provided with supporting members for contact between the heatsink and the substrate, the substrate having been provided with ground pads for contact between the substrate and the heatsink, said ground pads being isolated pads without electrical connections to other interconnect metal on the surface of the substrate, said substrate further having been provided with a first conductive trace and a second conductive trace with both traces surrounding a central surface area of the substrate above which a semiconductor device is to be mounted, comprising:

electrical contact established between at least one of said ground pads and a conductive trace;

the supporting members of the heatsink positioned above the ground pads on the surface of the substrate; and the supporting members of the heatsink making contact with the ground pads on the surface of the substrate.

27. The semiconductor package of claim 26 wherein said electrical contact established between at least of said ground pads and the conductive trace comprises:

an interconnecting trace provided in or on the surface of said substrate, having a first endpoint and a second endpoint;

a via interconnect provided at said first endpoint of said interconnecting trace, said via providing electrical contact with at least one ground pad on the surface of the semiconductor substrate; and a via interconnect provided at said second end point of said interconnecting trace, said via providing electrical contact with the conductive trace.

28. The semiconductor package of claim 26 wherein said electrical contact between at least of said ground pads and the conductive trace comprises:

a bond wire provided on the surface of said substrate, having a first end point and a second end point;

a contact pad provided at said first end point of said interconnecting trace, said contact pad providing electrical contact with at least one ground pad; and a contact pad provided at said second end point of said interconnecting trace, said contact pad providing electrical contact with the conductive trace on the surface of the substrate.

29. The semiconductor package of claim 26 wherein said substrate comprises a square or rectangular shaped semiconductor substrate on the surface of which interconnect metal is provided, said substrate comprising a geometric center formed by an intersection of diagonals of said square or rectangular substrate, further comprising a periphery or edge, whereby said substrate has been provided with interconnect metal in sequence and starting from the geometric center of the substrate, said interconnect metal comprising conductive traces in or on a surface area that expand from a geometric center of the surface of the substrate in a square or rectangular pattern, hereby referred to as the central surface area of the substrate, said central surface area of the substrate comprising the surface of the substrate over which a semiconductor device is mounted, said network of conductive traces provided in or on the surface of said central surface area providing a common point of electrical connection, the surface area of said central surface area being about equal to a surface area of the substrate over which a semiconductor die is mounted, said semiconductor substrate further comprising a first conductive trace that surrounds said central surface area of the substrate, forming a rectangular or square pattern in or on the surface of said substrate, said semiconductor substrate further comprising a second conductive trace that surrounds said central surface area of the substrate, said first conductive trace and said second conductive trace not simultaneously comprising a power trace and a ground trace, said semiconductor substrate further comprising ground pads that are located surrounding said first and said second conductive trace, said ground pads serving as pedestals on which said supporting members of said heatsink are placed, said ground pads making contact with said supporting members of said heatsink, said semiconductor substrate further comprising a network of input/output interconnect traces that expand from said central surface area of the substrate towards the periphery of the substrate, at least one of said interconnect traces originating around the periphery of said second conductive trace while not making contact with said second conductive trace, at least one of said interconnect traces terminating in a contact pad that is located at about the periphery of the substrate, said interconnect traces providing means for interconnecting said semiconductor device that is mounted on said substrate to at least one contact pad in the periphery of said substrate.

30. The semiconductor package of claim 29 wherein said first conductive trace surrounds said second conductive trace.

31. The semiconductor package of claim 29 wherein said second conductive trace surrounds said first conductive trace.

32. The semiconductor package of claim 29 wherein said first conductive trace comprises a ground trace.

33. The semiconductor package of claim 29 wherein said first conductive trace comprises a power trace.

34. The semiconductor package of claim 29 wherein said second conductive trace comprises a ground trace.

35. The semiconductor package of claim 29 wherein said second conductive trace comprises a ground trace.

36. The semiconductor package of claim 29 wherein said first conductive trace comprises a power trace while said second conductive trace comprises a ground trace.

37. The semiconductor package of claim 29 wherein said ground pads that are located surrounding said first and said second conductive trace comprise three ground pads.

38. The semiconductor package of claim 28 wherein said ground pads that are located surrounding said first and said second conductive trace comprise four ground pads.

39. The semiconductor package of claim 26 wherein said the supporting members of the heatsink comprise three supporting members.

40. The semiconductor package of claim 26 wherein said the supporting members of the heatsink comprise four supporting members.

41. The semiconductor package of claim 29 wherein said ground pads on the surface of the substrate comprise three ground pads.

42. The semiconductor package of claim 29 wherein said ground pads on the surface of the substrate comprise four ground pads.

43. The semiconductor package of claim 29 wherein ground pads provided on the surface of the substrate equal in number the supporting members of the heatsink.

44. The semiconductor package of claim 29 wherein ground pads provided on the surface of the substrate do not equal in number the supporting members of the heatsink.

* * * * *